US 6,469,827 B1

(12) United States Patent
Sweatt et al.

(10) Patent No.: US 6,469,827 B1
(45) Date of Patent: Oct. 22, 2002

(54) DIFFRACTION SPECTRAL FILTER FOR USE IN EXTREME-UV LITHOGRAPHY CONDENSER

(75) Inventors: William C. Sweatt, Albuquerque, NM (US); Daniel A. Tichenor, Castro Valley, CA (US); Luis J. Bernardez, Livermore, CA (US)

(73) Assignee: EUV LLC, Santa Clara, CA (US)

( * ) Notice: Subject to any disclaimer, the term of this patent is extended or adjusted under 35 U.S.C. 154(b) by 0 days.

(21) Appl. No.: 09/631,617

(22) Filed: Aug. 4, 2000

Related U.S. Application Data

(63) Continuation-in-part of application No. 09/130,224, filed on Aug. 6, 1998, now Pat. No. 6,118,577, which is a continuation-in-part of application No. 09/249,738, filed on Feb. 11, 1999, now Pat. No. 6,210,865.

(51) Int. Cl.[7] .................. G02B 5/08; G02B 5/18; G21K 5/04; G03B 27/54
(52) U.S. Cl. .................. 359/351; 359/568; 359/570; 359/571; 359/572; 359/857; 359/858; 355/67; 355/71; 378/34
(58) Field of Search .................. 378/34; 355/67, 355/71; 359/350, 351, 355, 387, 566, 568, 570, 571, 572, 576, 851, 857, 858, 859, 615

(56) References Cited

U.S. PATENT DOCUMENTS

| | | | | |
|---|---|---|---|---|
| 4,105,290 A | * | 8/1978 | Quinn | 359/571 |
| 4,798,446 A | | 1/1989 | Hettrick | |
| 4,915,463 A | | 4/1990 | Barbee, Jr. | 359/568 |
| 5,138,490 A | | 8/1992 | Hohberg et al. | 359/570 |
| 5,199,057 A | * | 3/1993 | Tamura et al. | 378/43 |
| 5,339,346 A | | 8/1994 | White | 378/34 |
| 5,361,292 A | | 11/1994 | Sweatt | 378/34 |
| 5,439,781 A | | 8/1995 | MacDowell et al. | 378/34 |

(List continued on next page.)

FOREIGN PATENT DOCUMENTS

| | | | |
|---|---|---|---|
| JP | 59-155920 | 9/1984 | |
| JP | 61-141135 | 6/1986 | |
| JP | 404120717 A | 4/1992 | 378/34 |
| JP | 07-301696 A | * 11/1995 | |

OTHER PUBLICATIONS

Sweeney, et al., "EUV Optical Design for a 100 nm CD Imaging System", *SPIE*, (3331) 2–10, 1998.

Fukuda, H., et al., "New Optics Design Methodology Using Diffraction Grating on Spherical Mirrors for Soft X–ray Projection Lithography", *J. Vac. Sci. Technol. B.*, 13(2), 366–370, 1995.

Schmiedeskamp, B., et al., "Electron–beam–deposited Mo/Si and MoxSiy/Si Multilayer X–Ray Mirrors and Gratings", *Optical Engineering*, 33(4) 1314–1321, 1994.

Patent Abstract of Japan, Publication No. 61141135, Jun. 28, 1986.

Patent Abstract of Japan, Publication No. 59155920, Sep. 4, 1984.

*Primary Examiner*—Cassandra Spyrou
*Assistant Examiner*—John Juba, Jr.
(74) *Attorney, Agent, or Firm*—Burns, Doane, Swecker & Mathis, LLP

(57) ABSTRACT

A condenser system for generating a beam of radiation includes a source of radiation light that generates a continuous spectrum of radiation light; a condenser comprising one or more first optical elements for collecting radiation from the source of radiation light and for generating a beam of radiation; and a diffractive spectral filter for separating first radiation light having a particular wavelength from the continuous spectrum of radiation light. Cooling devices can be employed to remove heat generated. The condenser system can be used with a ringfield camera in projection lithography.

54 Claims, 9 Drawing Sheets

U.S. PATENT DOCUMENTS

| | | | |
|---|---|---|---|
| 5,512,759 A | 4/1996 | Sweatt | 378/34 |
| 5,534,970 A * | 7/1996 | Nakashima et al. | 353/122 |
| 5,561,558 A * | 10/1996 | Shiono et al. | 359/565 |
| 5,631,721 A | 5/1997 | Stanton et al. | 355/71 |
| 5,682,265 A * | 10/1997 | Farn et al. | 359/571 |
| 5,815,249 A | 9/1998 | Nishi et al. | 355/71 |
| 5,848,119 A | 12/1998 | Miyake et al. | 378/43 |
| 6,002,520 A | 12/1999 | Hoch et al. | 359/565 |
| 6,033,079 A | 3/2000 | Hudyma | 359/857 |
| 6,099,146 A * | 8/2000 | Imamura et al. | 359/566 |
| 6,101,211 A * | 8/2000 | Wakabayashi et al. | 372/102 |
| 6,322,220 B1 * | 11/2001 | Sano et al. | 355/67 |

* cited by examiner

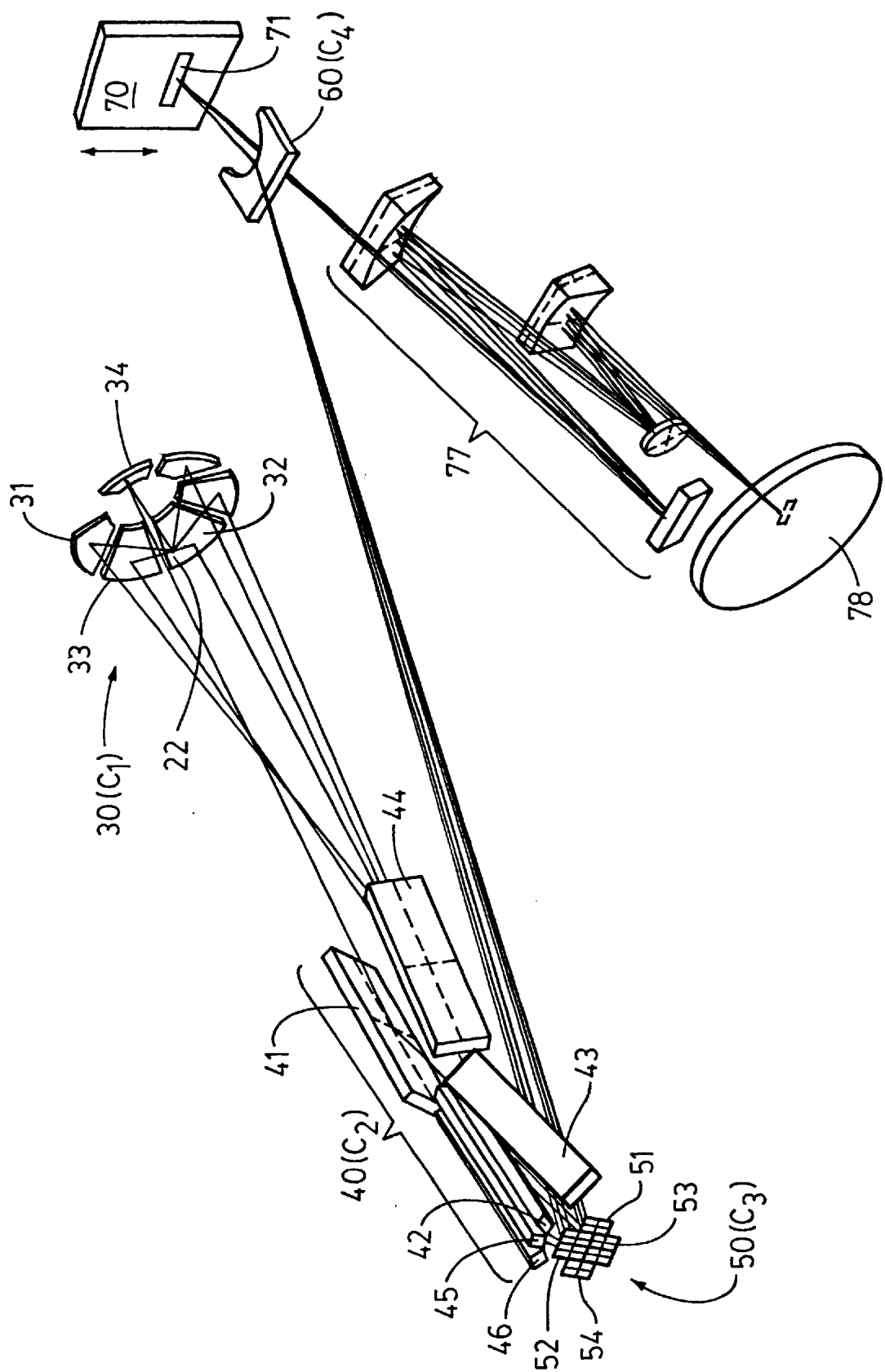
FIG._1A.

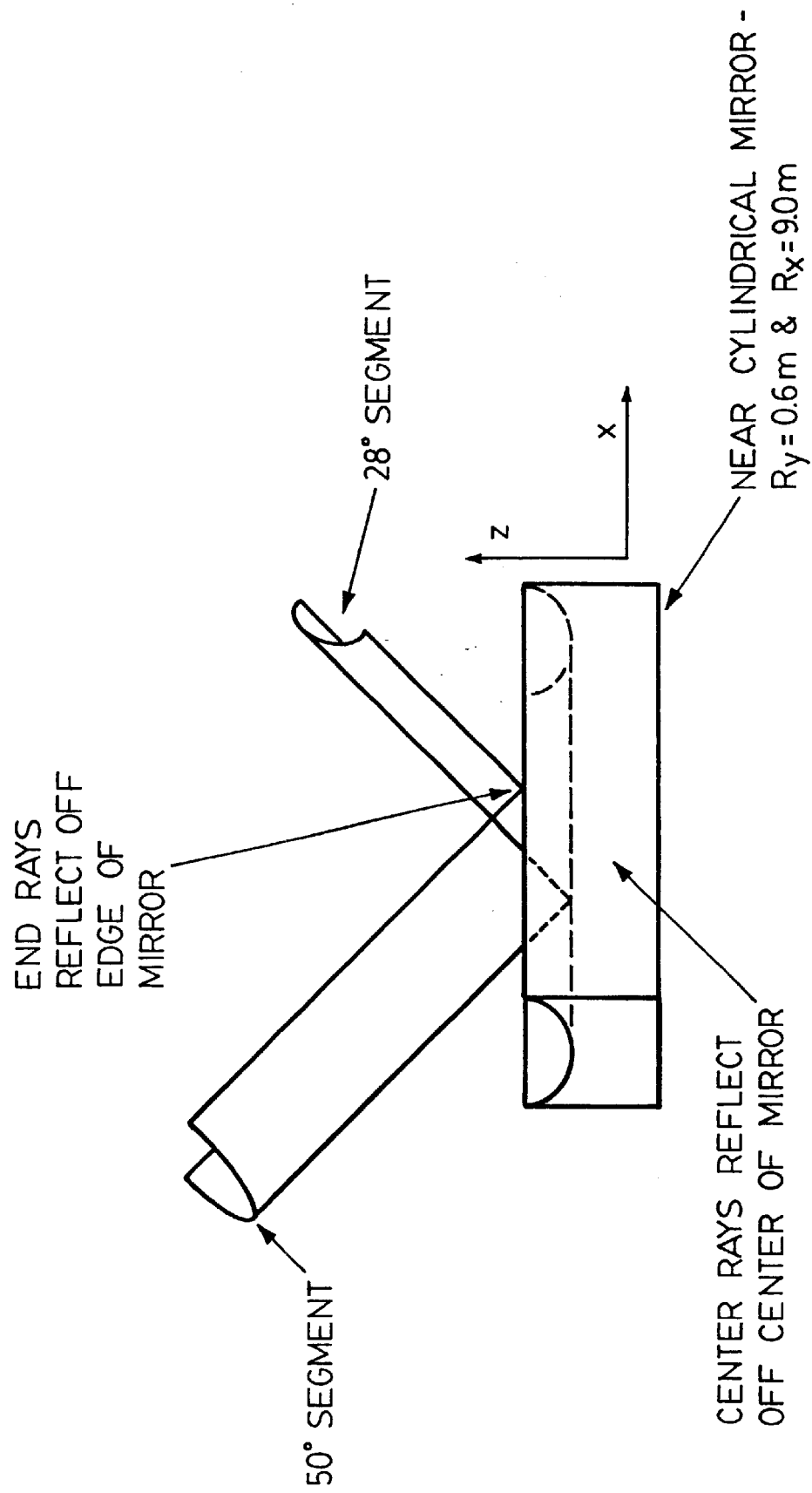
FIG._1B.

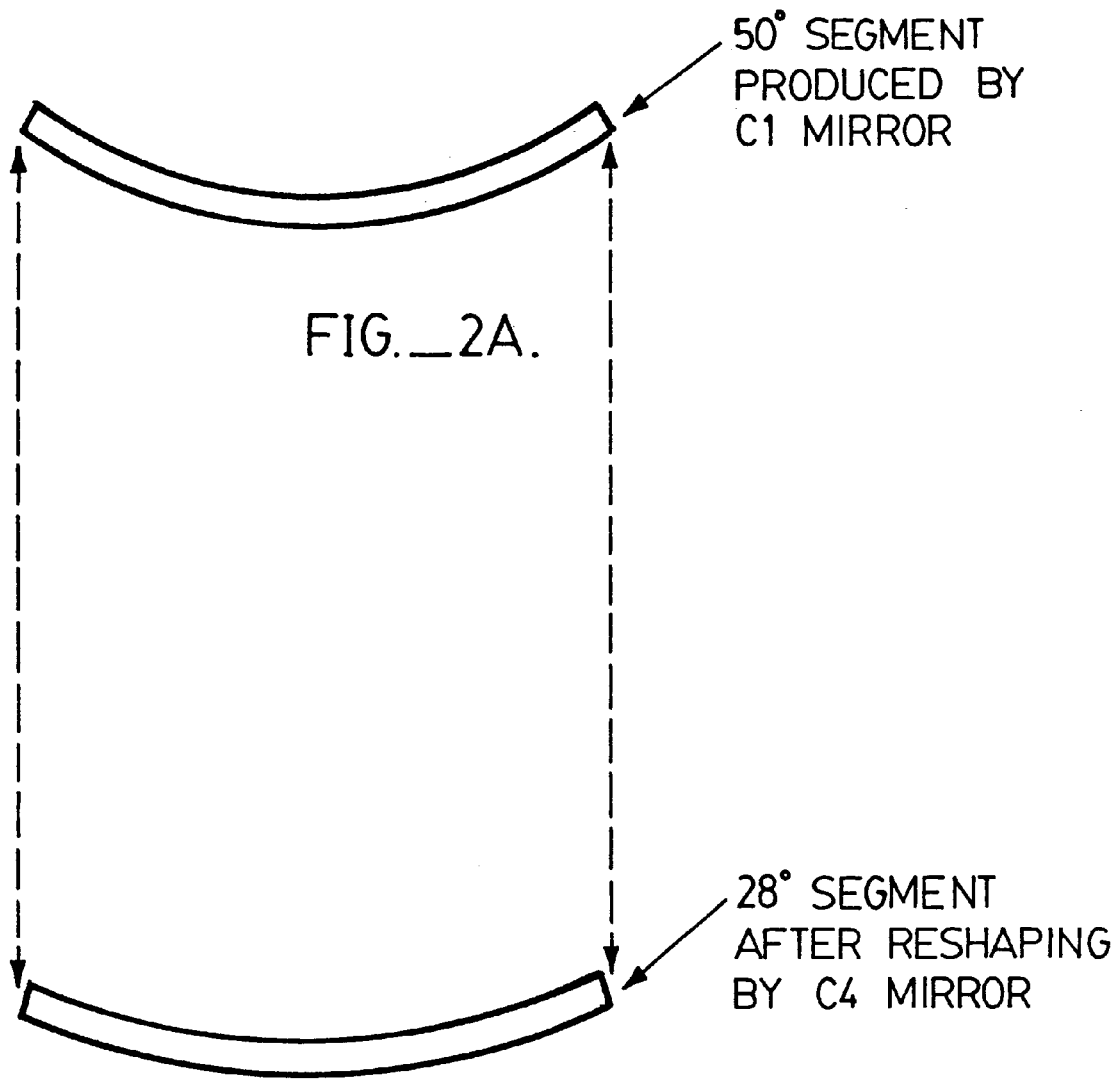

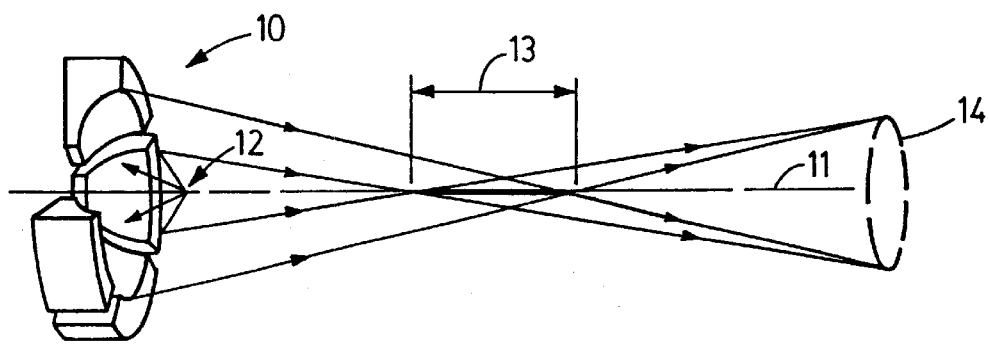
FIG._3.
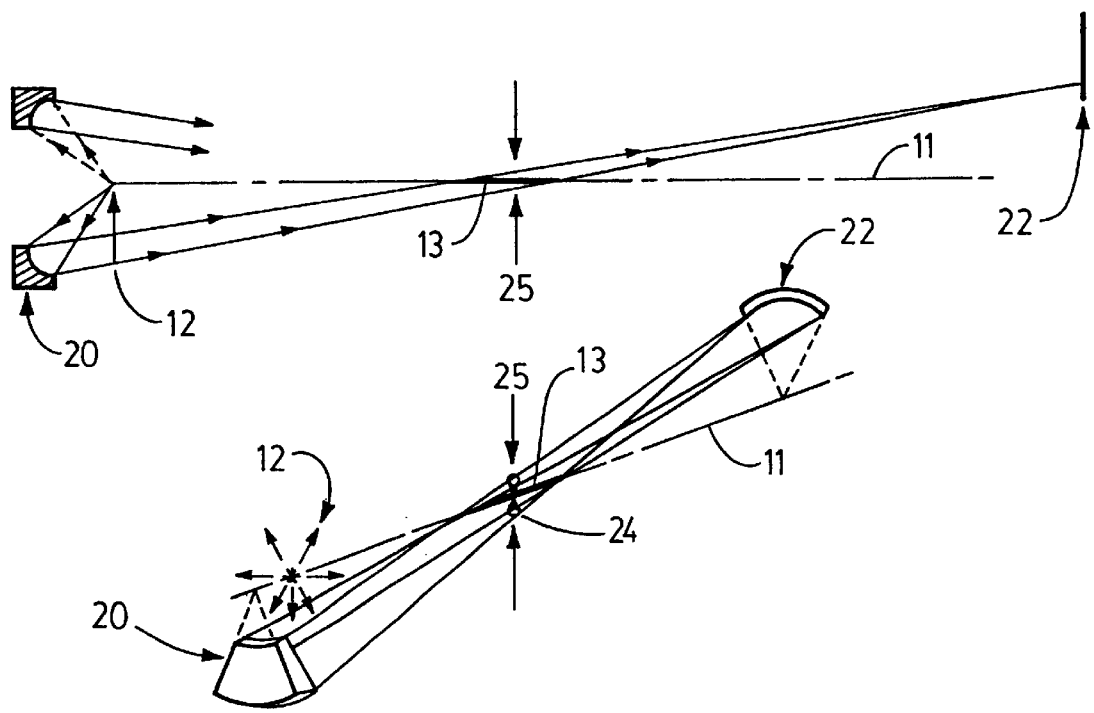
FIG._4.

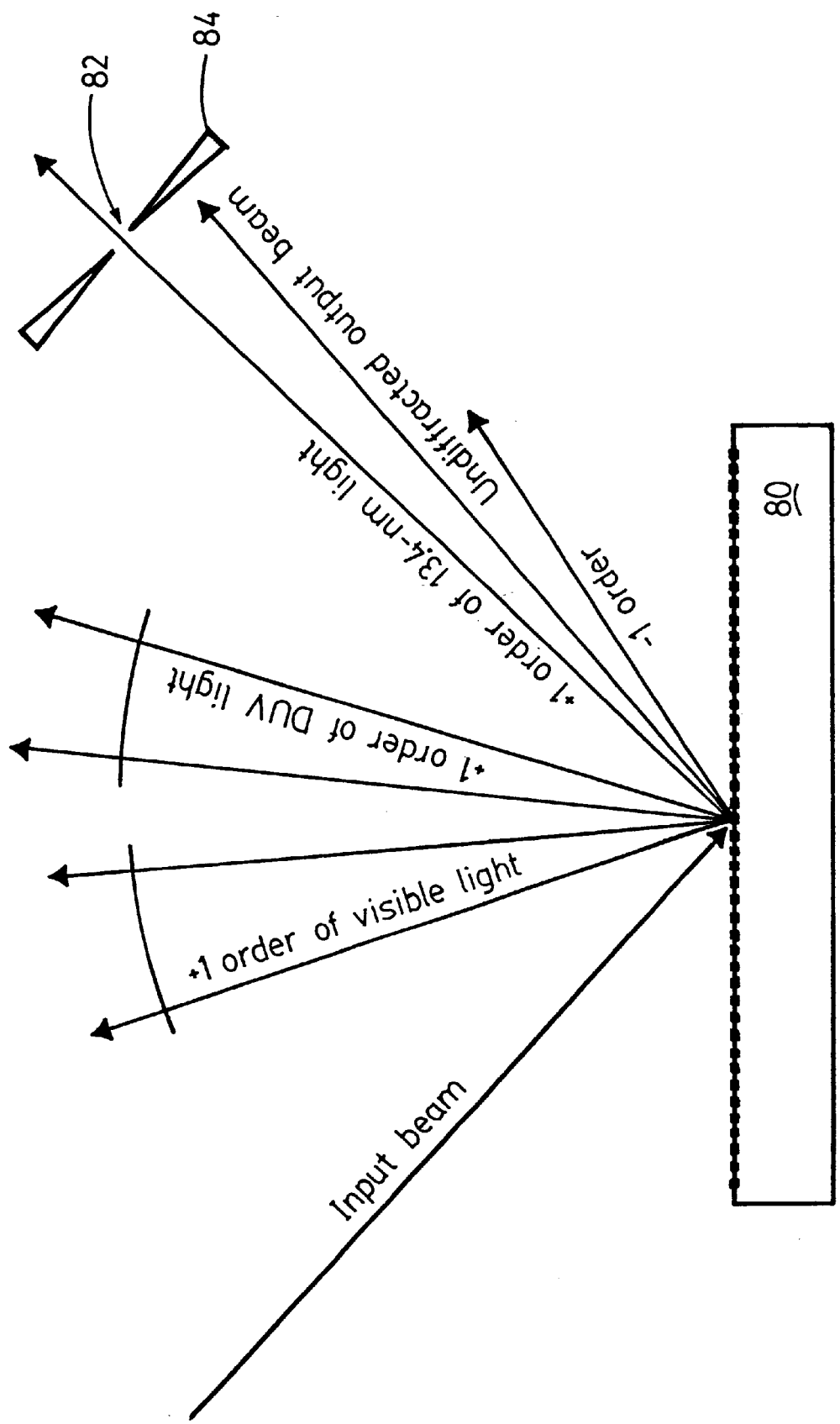
FIG._5.

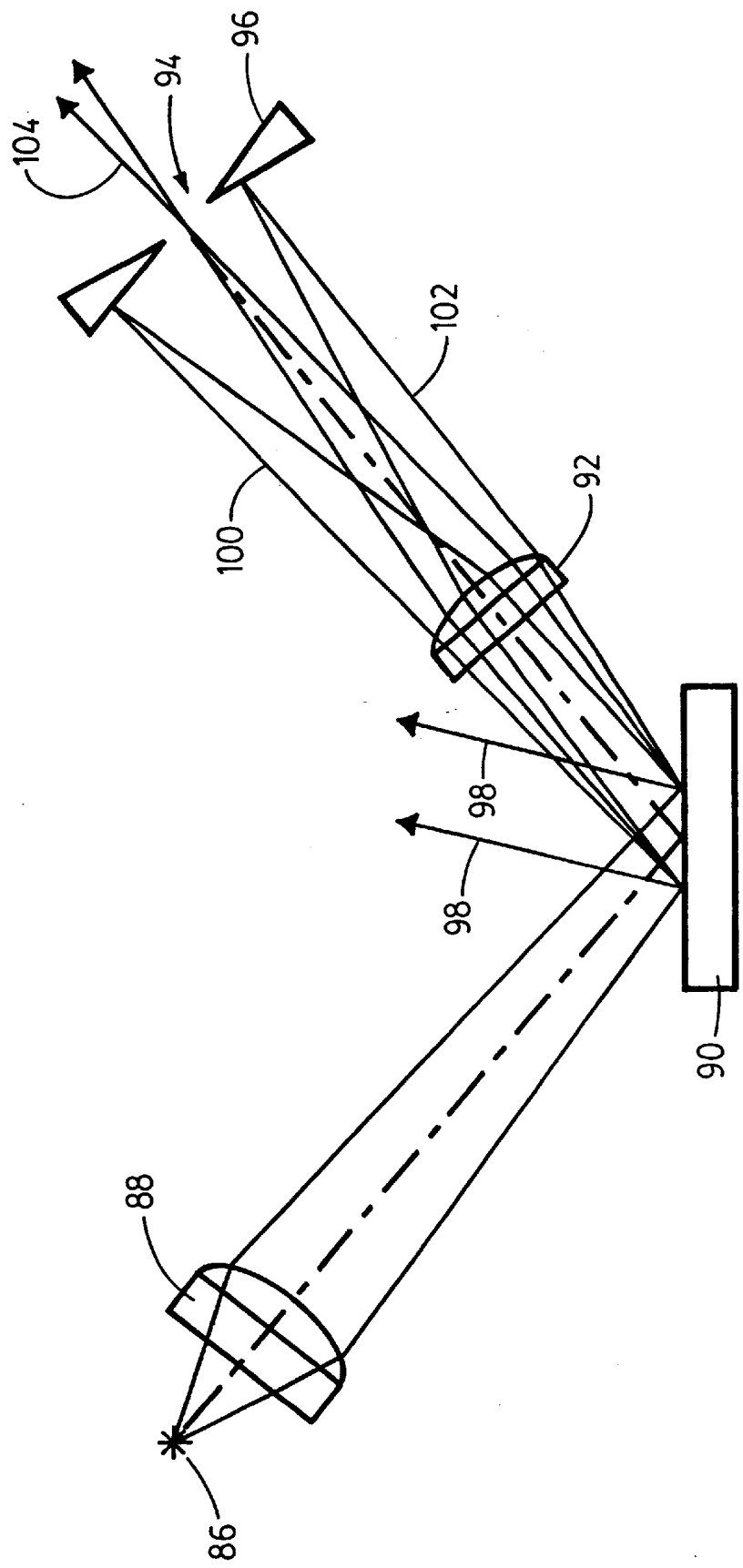
FIG._6.

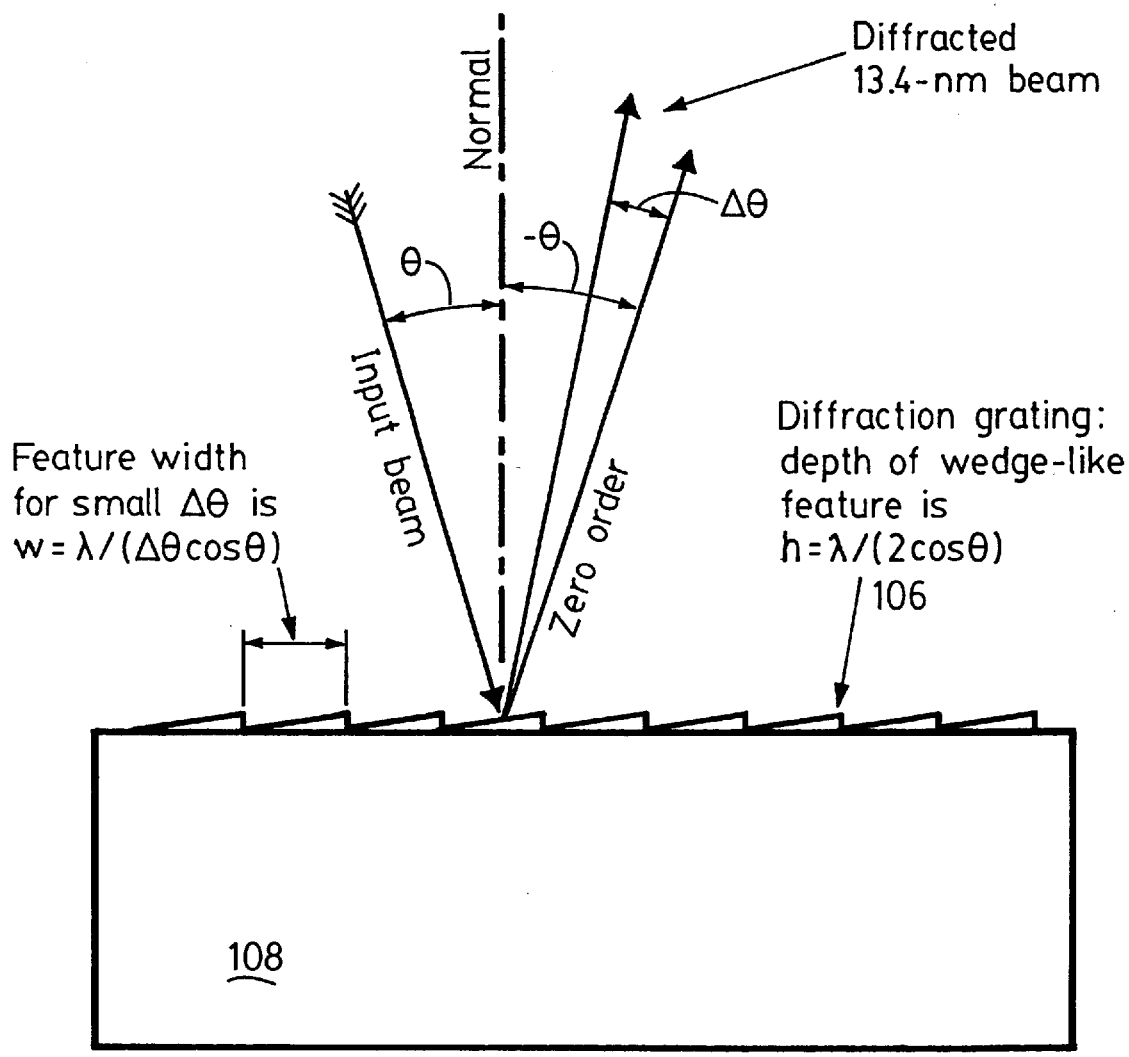
FIG._7.

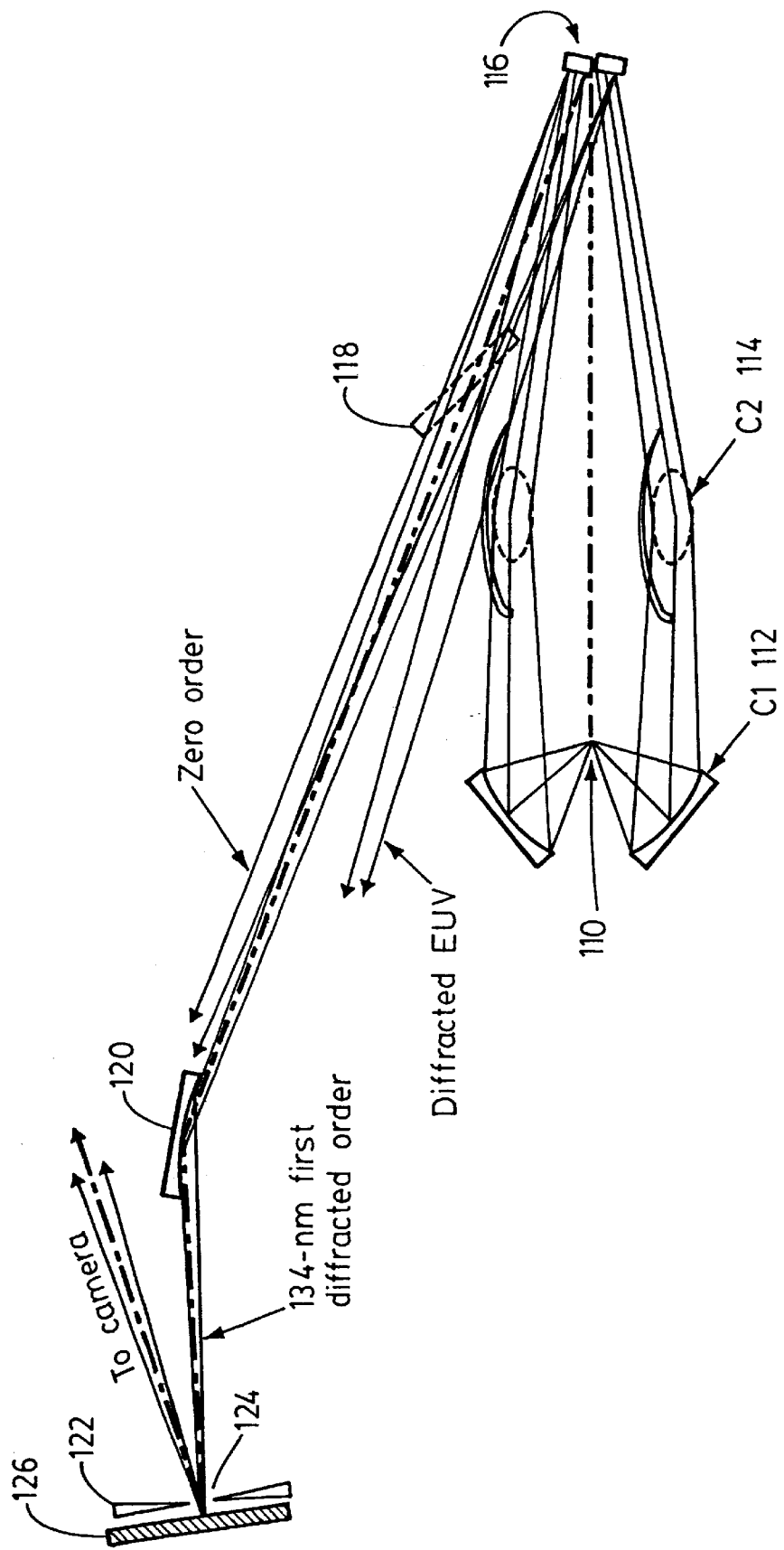
FIG._8.

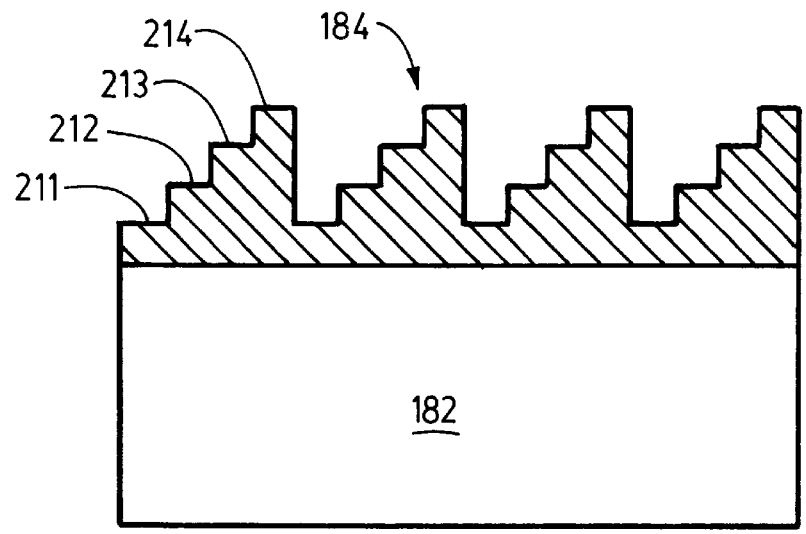
FIG._9.
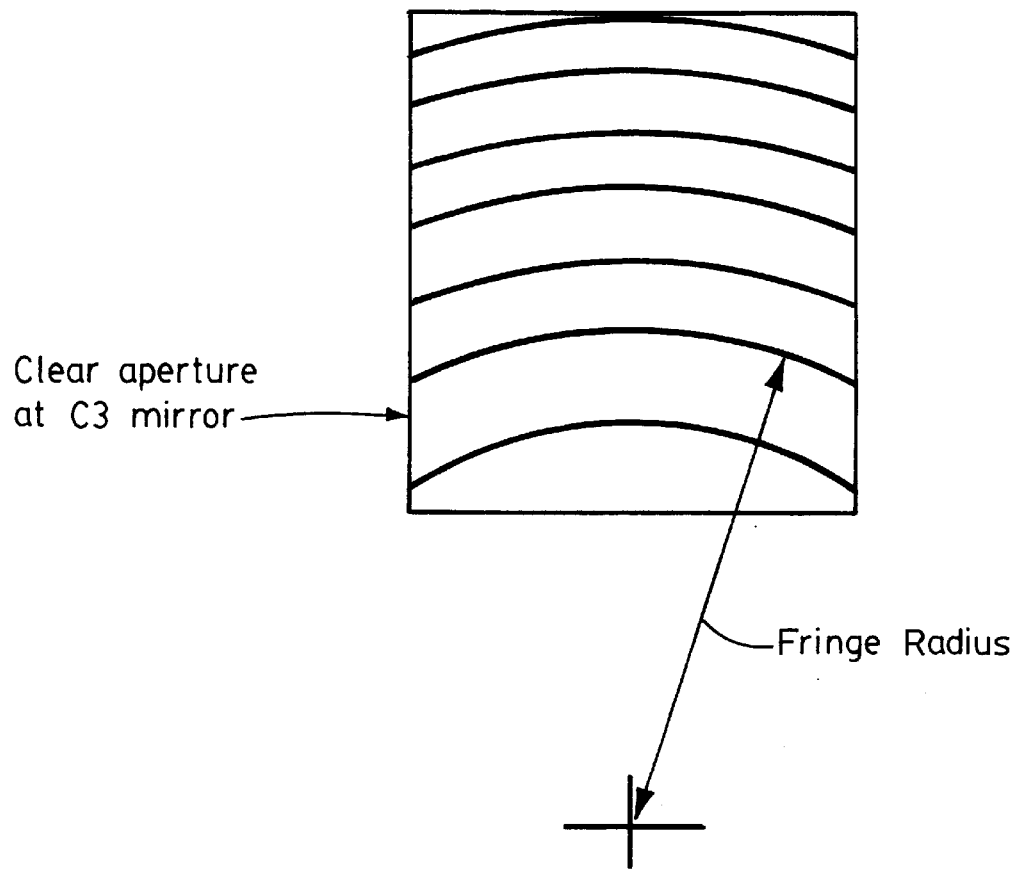
FIG._10.

DIFFRACTION SPECTRAL FILTER FOR USE IN EXTREME-UV LITHOGRAPHY CONDENSER

REFERENCE TO RELATED APPLICATION

This is a continuation-in-part application of Ser. No. 09/130,224 filed on Aug. 6, 1998, now U.S. Pat. No. 6,118,577, and of Ser. No. 09/249,738 filed on Feb. 11, 1999, now U.S. Pat. No. 6,210,865, both of which are incorporated herein by reference.

This invention was made with Government support under Contract No. DE-AC04-94AL85000 awarded by the U.S. Department of Energy to Sandia Corporation. The Government has certain rights to the invention.

FIELD OF THE INVENTION

This invention relates to diffractive spectral filters that are particularly suited for use with condensers and, particularly, condenser that collects radiation, here soft x-rays, from either a small, incoherent source and couples it to a camera designed for projection lithography.

BACKGROUND OF THE INVENTION

Projection lithography is a powerful and essential tool for microelectronics processing. As feature sizes are driven smaller and smaller, optical systems are approaching their limits caused by the wavelengths of the optical radiation. "Long" or "soft" x-rays (a.k.a. Extreme UV) (wavelength range of $\lambda=100$ to 200 Å) are now at the forefront of research in efforts to achieve the smaller desired feature sizes.

In photolithography, a condenser optical system couples radiation from a source to illuminate a mask plane which is relayed onto a wafer by an imaging system. Sources of radiation typically generate a continuous spectrum of radiation whereas the radiation of interest is EUV. Condensers typically employ a spectral purity filter or window made of silicon, beryllium, zirconium or other suitable transmitting material to let radiation of the desired wavelength(s), e.g., 13.4 nm, pass from the radiation source to reach the reticle mask. Unfortunately, 1 μm thick silicon window, for example, can absorb about half of the 13.4 nm radiation entering the window; a corollary is that the silicon window can become overheated. The art is still in search of techniques to improve spectral filtration efficiency and thermal management.

SUMMARY OF THE INVENTION

The present invention is directed to a condenser which employs a diffractive grating that functions as a spectral purity filter to eliminate out-of-band radiation from being projected onto a reflective reticle mask from the condenser.

The invention is based in part on the recognition that an input beam of radiation projected onto the diffractive grating will generate different orders of radiation. By properly designing the diffractive grating, the diffractive spectral filter functions to allow desired radiation to pass to the reticle mask without the attendant high level of waste associated with spectral filters that employ transmission windows.

Diffractive spectral filters offer a potentially crucial advantage in thermal management. Transmission windows are thin membranes that cannot be actively cooled. At commercial-tool flux levels, the membranes may overheat to the point of failure. Diffractive spectral filters are preferably fabricated on thick substrates that can be actively cooled like other condenser elements.

A preferred condenser employing the diffractive spectral filter includes a series of aspheric mirrors on one side of a small, incoherent source of radiation producing a series of beams. Each aspheric mirror images the quasi point source into a curved line segment. A relatively small arc of the ring image is needed by the camera; all of the beams are so manipulated that they all fall onto this same arc needed by the camera. Also, all of the beams are aimed through the camera's virtual entrance pupil. The invention is based in part on the recognition that improvement in overall system efficiency is achieved by including a correcting mirror for reshaping a beam segment. The improved condenser efficiently fills the larger radius ringfield created by today's advanced camera designs.

Accordingly, in one embodiment, the invention is directed to a condenser system for use with a ringfield camera that includes:

a small compact source of continuous spectrum of radiation light;

collector mirrors comprising at least two substantially equal radial segments of a parent aspheric mirror, each having one focus at the radiation source and a curved line focus filling the object field of the camera at the radius of the ringfield and each producing a beam of radiation;

a corresponding number of sets of correcting mirror means which are capable of translation or rotation, or both, such that all of the beams of radiation pass through the entrance pupil of the camera and form a coincident arc image at the ringfield radius, wherein at least one of the correcting mirrors of each set, or a mirror that is common to said sets of mirrors, from which the radiation emanates, is a concave relay mirror that is positioned to shape a beam segment having a chord angle of about 25 to 85 degrees into a second beam segment having a chord angle of about 0 to 60 degrees; and one or more diffractive spectral filters for separating first radiation light having a particular wavelength from the continuous spectrum of radiation light.

In another embodiment, the invention is directed to a condenser system for use with a ringfield camera that includes:

a small compact source of continuous spectrum of radiation light;

collector mirrors comprising at least two substantially equal radial segments of a parent aspheric mirror, each having one focus at the radiation source and a curved line focus filling the object field of the camera at the radius of the ringfield and each producing a beam of radiation;

a corresponding number of sets of correcting mirror means which are capable of translation or rotation, or both, such that all of the beams of radiation pass through the entrance pupil of the camera and form a coincident arc image at the ringfield radius, wherein at least one of the correcting mirrors of each set, or a mirror that is common to said sets of mirrors, from which the radiation emanates, is a concave relay mirror that is positioned to shape a beam segment having a chord angle of about 25 to 85 degrees into a second beam segment having a chord angle of about 0 to 60 degrees; and wherein the one or more of the corresponding number of sets of correcting mirrors means includes diffractive spectral filter means for separating first radiation light having a particular wavelength from the continuous spectrum of radiation light.

In a preferred embodiment, the concave mirror comprises six substantially equal radial segments of a parent aspheric mirror. In another preferred embodiment, the concave mirror shapes a beam having a chord angle of about 25 to 85 degrees and preferably at about 50 degrees into a second beam having a chord angle of about 0 to 60 degrees and preferably at about 28 degrees.

In another embodiment, the invention is directed to a process for fabricating integrated devices that includes at least one element having a dimension $\leq 0.25$ $\mu$m and preferably $\leq 0.18$ $\mu$m by projection lithography that employs the inventive condenser system.

BRIEF DESCRIPTION OF THE DRAWINGS

FIG. 1A is a perspective view of an EUV photolithography system showing the beams going through its set of correcting mirrors and showing the interaction of the beam with the camera;

FIG. 1B illustrates a steeply tilted biconvex mirror;

FIGS. 2A and 2B illustrate a beam segment before and after reshaping;

FIG. 3 is a side-view of the condenser system without correcting mirrors, showing the reimaging of the point source into a ringfield with the images crossing over the center line of the system;

FIG. 4 is another side-view showing the geometries of the mirrors and the beams in more detail or this embodiment;

FIGS. 5 and 7 illustrate a diffraction element;

FIGS. 6 and 8 illustrate a diffraction element in a condenser system; and

FIG. 9 illustrates blazed gratings; and

FIG. 10 illustrates a plan view of an off-axis focus blazed grating.

DETAILED DESCRIPTION OF THE INVENTION

The present invention is directed to condenser systems that employ a diffractive spectral filter to remove out-of-band radiation from a source of radiation. While the invention will be described with respect to a particular condenser, it is understood that the diffractive spectral filter can be employed with any condenser particularly those employed in photolithography. Condenser illumination systems include, for example, Kohler and critical illumination condenser systems. Condensers can be coupled to a variety of radiation source including, for example, line-shaped plasma source or an arc-shaped discharge source. Condenser are described, for example, in U.S. Pat. Nos. 5,361,292, 5,737, 137, and 6,033,079 which are incorporated herein by reference.

The overall layout of a preferred EUV lithography system is shown in FIG. 1A. The radiation is collected from the source 22 by mirror segments 30 (referred to collectively as the "$C_1$" mirrors) which create arc images that are in turn are rotated by roof mirror pairs illustrated collectively as mirrors 40 and 50 (referred herein as the "$C_2$" and "$C_3$" mirrors, respectively). Beams of radiation reflected from mirrors 50 are reflected by a toric mirror 60 (or $C_4$ mirror) to deliver six overlapped ringfield segments onto reflective mask 70. At least two segments of the parent mirror 30 are employed. Typically, the parent mirror is partitioned into 2 to 12 segments, preferably into 5 to 8 segments, and most preferably into 6 segments as shown. As an example, mirror 31 creates an arc image and roof mirror pair 41 and 51 rotates the arc image to fit the slit image and translate it to the proper position. Similar arc images are created and processed by mirror combinations 32, 42, and 52, and so on. Mirrors 41, 42, and 43 are parts of different and unique channels; and the group of mirrors 44, 45, and 46 is a mirror image of the group of mirrors 41, 42, and 43, respectively.

The distance from the $C_3$ mirrors defining the condenser's pupil to the $C_4$ mirror should be 3 to 10 times as long as the distance from the $C_4$ mirror to mask 70. An illustrative arc 71 is shown on mask 70.

The EUV lithography system further includes a ringfield camera 77 having a set of mirrors which images the mask using the radiation onto wafer 78. As is apparent, the $C_4$ mirror follows the real entrance pupil.

Each of the six pairs of $C_2$ and $C_3$ mirrors act as a roof-mirror pair that rotate and translate the 6 channels so that they overlap. Specifically, the $C_2$ and $C_3$ mirror pairs rotate the arcuate images produced by the $C_1$ mirrors so that they can be superimposed at the mask plane. The $C_2$ mirrors are preferably flat and are used at grazing incidence, which is preferably 82 degrees angle of incidence for the chief ray. The chief ray angle of incidence is preferably constrained to have the same angle of incidence at each $C_2$ mirror so that the reflectivities will be the same. Further, the $C_1$ angles are preferably tilted about the source to allow the angles of incidence to be the same at $C_1$. The $C_3$ mirrors typically have weak convex spherical surfaces which relay the $C_1$ arcuate images onto the mask. The $C_3$ mirrors are located at the system pupil (i.e., where the azimuthal beam cross-section is a minimum) to facilitate packaging and are tilted to overlay the arcuate images from the six channels. The $C_3$ mirrors are preferably positioned as close together as possible (approximately 3 mm separates the clear apertures) to maximize the amount of EUV that can be directed into the camera.

FIG. 1C depicts the $C_4$ field mirror 60 which is toroidally (or elliptically) shaped. As shown, a beam cross section 62 from the condenser is reflected from the surface of the mirror 60 to form a curved slit illumination 71 on moving mask 70 (FIG. 1A). Beam 75 is propagated from the mask into the camera. The toroid images the real pupil containing the $C_3$ mirrors into the entrance pupil of the camera. The focal length of mirror $C_4$ can be determined from the lens maker's equation. The radii of curvature $R_x$ and $R_y$ are functions of the focal length and the angle of incidence $\theta$, as determined by Coddington's equation. The tilt angle also tends to distort the cross-section of an incident beam, with the distortion increasing with angle of incidence. The source of this distortion is shown in FIG. 1B. Specifically, FIG. 1B illustrates an embodiment of the $C_4$ biconcave mirror where $R_y$ is 0.6 m and $R_x$ is 9.0 m. As is apparent, remapping occurs when the middle of the 50 degrees segment is reflected off the bottom of the nearly cylindrical, steeply tilted concave mirror while the ends reflect off the edges of the mirror which are higher.

FIGS. 2A and 2B shows a beam segment before and after reshaping. Note that the ends of the 50 degrees segment curl far more than those of the 28 degrees segment.

The lithography system preferably employs a small, compact source of radiation which generates a continuous spectrum of radiation including, for example, EUV, ultraviolet rays, and visible light. An example of such a source is a laser-generated plasma. "Small" implies a radiating volume with dimensions in the three principle directions smaller than about 0.2 mm. "Compact" implies that the three dimensions are roughly the same, differing from one-another by less than a factor of two. These lengths are defined as the full width between the half-maximum intensity points.

For EUV lithography, the illumination radiation preferably has a wavelength from about 9 nm to 18 nm and preferably about 13.4 nm. In order to filter out radiation that does not have the desired wavelength, the lithography system employs a diffraction spectral filter. In the preferred embodiments, a blazed, or high efficiency grating is added to the condenser (as shown in FIG. 1A) that diffracts most (>98%) of the out of band light out of the beam so it does not, among other things, heat the reticle mask. This is preferably accomplished by:

A) adding a reflecting surface upon which the grating is fabricated;

B) fabricating the blazed grating on a curved mirror that already exists in the condenser; this technique is described in application Ser. No. 09/130,224 filed on Aug. 6, 1998 entitled "Diffractive Element in Extreme-UV Lithography Condenser", now U.S. Pat. No. 6,118,577, which is incorporated herein;

C) replacing a flat mirror that already exists in the condenser with a flat reflecting grating; or D) replacing a powered mirror in the existing design with an off-axis section of a focusing grating. In one embodiment, the off-axis section of the focusing grating has a flat surface.

Alternatives C and D are preferred because they maximize the system transmission for a number of reasons. First, no new surface is added as in alternative A, and second, the efficiency of the grating element can be maximized because the blazed grating can be fabricated with lithographic processes on a superpolished flat surface. The layers added in the lithographic processes can also be very smooth, which minimizes scattering, and thus maximize the efficiency. Moreover, during the lithographic process, successive masks that define the layers can be accurately aligned.

The principle of the filter is shown in FIG. 5 which depicts a blazed, reflective grating 80, that is tilted so that the positive (or negative) first diffracted order passes through an aperture 82, whereas the rest of the light does not. As illustrated, this filter is expected to reject essentially all light outside of the wavelength band from about 9 nm to about 18 nm and about half of the light in this band that is not in the 13-nm to 14-nm sub-band will also be blocked by the light absorbing member 84 which is preferably made of any suitable radiation absorbing material such as aluminum.

FIG. 6 illustrates the positioning of a diffraction spectral filter and radiation absorbing member in the condenser. The radiation from the light source 86 is collected by a first set of mirrors 88 which produces a beam that converges to a smaller size and encounters a blazed grating 90. The grating can be linear or it could be fabricated on a curved substrate and therefore contain some focusing power. A powered mirror 92 is preferably positioned in the beam chain between the blazed grating 90 and radiation absorber member 96 which includes aperture 94. As illustrated, visible light 98 which is not diffracted by the diffraction spectral filter 90 does not enter aperture 94 because the angle of reflection whereas deep-UV 100 which is diffracted is absorbed by the absorber member 96. Furthermore, some undiffracted radiation 102 which contains the deep-UV and visible radiation is also absorbed by the absorber member 96. Finally, in a preferred embodiment, 13.4 nm EUV 104 is diffracted into the aperture 94. The absorber member with the aperture could be located just in front of a reticle mask (not shown).

If it were positioned some distance upstream of the reticle mask, then more optics may be needed between the absorber member and the reticle mask.

The gratings shown in FIG. 7 are blazed gratings that comprise a series of ramps. The gratings comprise right triangular structures that are formed on substrate 182. FIG. 9 illustrates a "quantized" blaze grating that is easier to fabricate than those of FIG. 7. As is apparent, each triangular structure is represented by a series of steps or levels 211, 212, 213 and 214. The number of quantization levels is typically equal to $2^N$ where N is the minimum number of etch steps required in the fabrication process and typically ranges from 2 to 32 and preferably from 8–16.

In addition, minimizing the required diffraction angle minimizes the grating frequency, which maximizes the feature width w shown in FIG. 7. The larger w is, the easier the grating is to make. This is why locating the gratings on $C_2$ or $C_3$ (and not on the $C_4$, mirror as shown in FIG. 1A) is preferred.

Techniques for fabricating diffraction gratings including blazed gratings are known in the art as described for example in U.S. Pat. Nos. 4,895,790, 4,915,463, 5,638,212, and 5,737,125 which are incorporated herein by reference. A preferred method is to employ binary optics surface relief technology to fabricate the diffraction grating on one or more mirrors of the condenser. Binary optics is described in Handbook of Optics, Vol. II, Ch. 8, 2nd Ed. (McGraw Hill, Inc. 1995.) In the case of a near-normal mirror, the blazed grating is preferably constructed on a substrate before a reflective multilayer, e.g., alternating Si and Mo layers, is deposited over the grating. For a near-grazing incidence mirror, the blazed grating is usually constructed on the substrate before the reflective metal surface is deposited. Alternatively, the reflective metal surface is first deposited on a substrate and the blazed grating is formed thereon. The blazed grating is preferably made from the same material as the reflective layer. This scheme approximates the ramp (the ideal shape) with a series of steps. Because these steps are a fraction of a wavelength high (from step to step), most of the light is diffracted as though it were reflecting from the ramp. If a ramp (introducing a 2-pi phase shift from step to step) is simulated with 8 steps; theoretically 95% of the reflected light would be diffracted into the first order. (4 steps theoretically yields >80% and 16 steps theoretically yields >99%). The 8-step ramp can be fabricated using 3 masks and 3 deposition steps. Deposition of layers rather than etching is preferred because very smooth layers can be deposited on a superpolished substrate, while etching away material might leave a rougher surface. A method of manufacturing a blazed diffraction grating on a curve surface that employs a diamond scoring tool is described in U.S. Pat. No. 5,638,212, which is incorporated herein. A collimated beam of hard x-rays can be employed with a hard (i.e., stiff) transmissive mask that is either flat or curved.

In the case where the spectral filter gratings are fabricated on the $C_2$ mirrors (FIG. 1A), the large angle of incidence is an advantage. The effect of the surface roughness of the substrate and the deposited layers are less, reduced proportionally to the cosine of the angle of incidence. Also, the thickness of the layers will be larger so they would be easier to deposit to a given accuracy. However, the beam footprints on these mirrors are relatively large, and the orientation of the reflected image is different on each mirror. This changes the required orientation and width of the fringes from mirror to mirror.

In the case where the spectral filter gratings were fabricated on the $C_3$ mirrors (FIG. 1A) the advantages are that all of these mirrors are all small and nearly identical. Furthermore, the orientation of the beam is also the same on all mirrors. The disadvantages are that the required feature height is small and the width is fairly small, though manageable.

As illustrated in FIGS. 2A and 2B, in a preferred embodiment of the condenser, the $C_4$ mirror reshapes the beam segments to create a more elongated illumination pattern on the reticle mask. Therefore, in one embodiment, aperture 82 of absorbing member 84 as shown in FIG. 5 comprises a plate with an elongated aperture or slit that is dimensioned so that some of the EUV radiation is absorbed by the plate and the portion that passes through the aperture defines the desired illumination pattern. It should be noted that preferably the light is diffracted perpendicular to the slit to minimize the required angle.

Fabrication of a blazed grating requires the use of two or more masks to simulate a ramp function. These masks have to be registered very accurately relative to one-another so that the sum of the depositions is a series of equal-length steps. This alignment is reasonable to accomplish when the mirror blank is flat, but is very difficult when it is curved. Thus creating a blazed, linear grating on a curved substrate is difficult.

The $C_3$ mirror is curved, so if the diffraction spectral filter is to be created on it, some other accommodation has to be made. One approach is to create the nearly linear blazed grating on a flat surface, and add some power to it as shown in FIG. 10, which is a plan view of an off-axis focus blazed grating on the clear aperture of the $C_3$ mirror. Seven fringes are shown and the spacing between the fringes is notional. In this fashion, the focusing power in the grating replaces the power due to the mirror's curvature. The grating for this embodiment will be similar to a focusing grating with an off-axis aperture. Thus the fringes will be largely concentric about a point well outside the aperture, and the spatial frequency of the fringes will vary proportional to the fringe radius.

Referring to EUV photolithography system shown in FIG. 1A, the diffraction grating could be fabricated on any of the mirrors in the system and preferably on the $C_2$ or $C_3$ mirrors for the reasons provided above. Alternatively, another mirror which contains a diffraction grating can be added to the system. In this latter scenario, the additional mirror is preferably a near-grazing incidence (80°) flat mirror that is located just downstream of the $C_3$ mirror array. The mirror preferably has a linear grating on its surface and the fringe (line) width should be greater than 30 $\mu$m. The diffraction grating can be fabricated by a 16-step approximation to the blaze using contact printing. For a mirror made of Ru, given that the raw reflectivity of Ru is about 85% and that the theoretical loss of a 16-step approximation is only 1%, the expected efficiency of this spectral filter should be theoretically about 64% and typically, perhaps as large as about 80%. In conjunction with the additional mirror with the diffraction grating, the system would also include an absorber member located in front of reticle mask 70.

In the alternative embodiment of creating a diffraction grating on one of the existing mirrors, referring to FIG. 1A the $C_2$ or $C_3$ mirrors are two possible sites for the grating. With respect to the grazing incidence $C_2$ mirrors, these are relatively large ($\approx$150 mm long) so they would be contact printed (perhaps in two steps). In addition, the beam orientations (relative to the angle of incidence) on these grazing-incidence flats will vary from beam to beam. Indeed, because some of the angles might be almost perpendicular to the preferred direction in which the beams need to be diffracted, the fringes may be only a few microns apart. This may require that a 4-step approximation be implement thereby limiting the efficiency to only 80%.

The six $C_3$ mirrors are the preferred sites for locating the diffraction gratings. Each mirror is relatively small, preferably roughly 7 mm by 15 mm, so the gratings could be written with an E-beam writer or a projection lithography tool. As designed, the $C_3$ mirrors are typically spherical with a 6 meter radius and it may be difficult to write on these surfaces. As an alternative, a diffraction grating can be designed that includes the dispersion of the linear grating and the focusing power of the as-designed mirror. As designed, the $C_3$ mirror is roughly normal, and the minimum diffraction angle required is about 2.5 mr. Therefore, the fringe spacing preferably ranges from about 2 $\mu$m to about 6 $\mu$m (for both ramp and focusing power). In the case of a near normal $C_3$ mirror, the spatial frequency preferably ranges from about 150 to 2000 mm$^{-1}$ and the blaze height is preferably about 5 nm to 80 nm. A sixteen-step approximation to the ramp creates a minimum feature size of about 0.125 $\mu$m. This can be readily implemented with E-beam or existing steppers. Moreover, adding a diffraction grating on $C_3$ might only scatter a few percent of the EUV out of the system. Preferably the visible and EUV light is displaced by at least 6 mm relative to the EUV. This should keep the unwanted radiation off the reticle mask.

The $C_2$ mirror array could contain the grating. Each flat $C_2$ mirror would be replaced with another flat with a linear grating on it. However, since the optimum angle at which the beam diffracts changes from beam to beam since the $C_2$ mirrors are part of the beam rotation system, and each beam is rotated at a different angle. Thus, each $C_2$ mirror would have to be different. In the case of a grazing incidence $C_2$ mirror, the spatial frequency preferably ranges from about 70 to 1000 $\mu$mm$^{-1}$ and the blaze height is preferably about 25 nm to 50 nm.

If an extra mirror is added to each beam line, each mirror is expected to attenuate the beams by roughly 15%, but they might add some extra flexibility to the design. They could be added near the $C_3$ mirror, or anywhere between the $C_1$ and $C_3$ mirrors.

FIG. 8 illustrates the implementation of diffraction grating spectral filter in the EUV photolithography system. Radiation from source 110 is collected and processed by a condenser to produce a ringfield illumination field and for illuminating reticle mask 126. The condenser comprises mirrors $C_1$, $C_2$, $C_3$, and $C_4$ whose functions are described above. The system includes an absorber member 122 having aperture 124. In one embodiment, the $C_3$ has diffraction grating on the surface. In an alternative embodiment, an additional flat mirror 118 having a diffraction grating is employed. In either case, the diffraction grating functions as a spectral filter so that only the 13.4 nm first order diffracted order light will pass the aperture 124 and illuminate the reticle mask 126. Much of the unwanted light will not pass through the aperture 124.

A preferred embodiment of the condenser includes means to actively cool the C3 (116) mirror which has the diffraction grating formed on the front mirror surface. For example a source of coolant 130 (e.g., water) is circulated into a chamber 131 that is positioned to be in thermal contact with the back surface of the C3 mirror. Cooling the mirror will, among other things, prevent it from thermal damage.

Condensers of the present invention are particularly suited for use in projection lithography for fabricating integrated devices that comprise at least one element having a dimension of $\leq$0.25 $\mu$m and preferably $\leq$0.18 $\mu$m. The process comprises construction of a plurality of successive levels by lithographic delineation using a mask pattern that is illuminated to produce a corresponding pattern image on the device being fabricated, ultimately to result in removal of or addition of material in the pattern image regions. Typically, where lithographic delineation is by projection, the collected radiation is processed to accommodate imaging optics of a projection camera and image quality that is substantially equal in the scan and cross-scan directions, and smoothly varying as the space between adjacent lines varies. In a preferred embodiment, projection comprises ringfield scanning comprising illumination of a straight or arcuate region of a projection mask. In another preferred embodiment, projection comprises reduction ringfield scanning in which an imaged arcuate region on the image plane is of reduced size relative to that of the subject arcuate region so that the imaged pattern is reduced in size relative to the mask region.

As shown in FIG. 3, the illuminator or collecting mirrors are composed of six off-axis segments of an aspheric mirror, each 50 degrees wide, producing six beams which each cross over the system axis or centerline 11 as defined by the source and the center of the parent mirror. The parent aspheric mirror 10 images the "point" source 12 into a ring image 14. Therefore, its cross-section in the r-z plane is elliptical with one of the foci at the plasma source and the other at the ringfield radius. Each of the 50 degree mirror segments images the source into a 50 degree segment of the ring image.

FIG. 4 shows both a meridian cross-sectional view and an isometric view of the beam from one segment 20 of the aspheric mirror, with the isometric view rotated relative to the side view about a line 25 passing through the area of the beam having a smallest beam cross section. It shows the shape of the collector mirror 20, the arc image 22, and the bow-tie-shaped minimum beam cross-section 24, which is located at the center of the axial line focus. This design gives uniform illumination along the length of the arc 22.

Another preferred system employs a laser plasma source that emits soft x-rays where the diameter and height of the source is about 150 µm. The camera at the other end of the system images a 28 degree, 100 mm long by 4 mm wide ringfield onto the wafer at 4× reduction. The entrance pupil is 3 m behind the reflective object mask, and the numerical aperture of the camera is n.a. =0.10 at the wafer and 0.025 at the mask.

The $C_4$ mirror images the real entrance pupil (the $C_3$ plane) into the camera's entrance pupil. The size of this image should not vary significantly from that chosen to give the correct partial coherence (i.e. σ=0.7). Because the fuzziness of the image is relatively unimportant, a simple toroid can be used to reimage the pupil.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A condenser system for use with a ringfield camera comprising:
   a small compact source of continuous spectrum of radiation light;
   collector mirrors comprising at least two substantially equal radial segments of a parent aspheric mirror, each having one focus at the radiation source and a curved line focus filling the object field of the camera at the radius of the ringfield and each producing a beam of radiation;
   a corresponding number of sets of correcting mirror means which are capable of translation or rotation, or both, such that all of the beams of radiation pass through the entrance pupil of the camera and form a coincident arc image at the ringfield radius, wherein at least one of the correcting mirrors of each set, or a mirror that is common to said sets of mirrors, from which the radiation emanates, is a concave relay mirror that is positioned to shape a beam segment having a chord angle of about 25 to 85 degrees into a second beam segment having a chord angle of about 0 to 60 degrees; and
   one or more diffractive spectral filters for separating first radiation light having a particular wavelength from the continuous spectrum of radiation light.

2. The condenser system of claim 1 further comprising one or more absorptive members for absorbing at least a portion of radiation light of a wavelength other than that of the first radiation light.

3. The condenser system of claim 1 wherein the first radiation light has a wavelength of about 13.4 nm.

4. The condenser system of claim 1 wherein the said collector mirrors comprise six substantially equal radial segments of a parent aspheric mirror.

5. The condenser system of claim 1 wherein said concave relay mirror shapes a beam having a chord angle of about 50 degrees into a second beam having a chord angle of about 28 degrees.

6. The condenser system of claim 5 wherein the concave relay mirror reflects radiation from the source of radiation at an angle of incidence greater than 50 degrees as measured from normal at the center of the concave relay mirror.

7. The condenser system of claim 1 wherein the one or more spectral filters is fabricated on one or more of the corresponding number of sets of correction mirror means.

8. The condenser system of claim 7 wherein the one or more spectral filters comprise a diffraction grating that has a blazed-phase configuration.

9. The condenser system of claim 8 wherein the one or more spectral filters is fabricated on one or more near normal mirrors and the diffraction grating has a spatial frequency of about 150 $mm^{-1}$ to 2000 $mm^{-1}$ and a blaze height of about 5 nm to 8 nm.

10. The condenser system of claim 8 wherein the one or more spectral filters is fabricated on one or more grazing incidence mirrors and the diffraction grating has a spatial frequency of about 70 $mm^{-1}$ to 1000 $mm^{-1}$ and a blaze height of about 25 nm to 50 nm.

11. The condenser system of claim 8 wherein the diffraction grating is a discrete profile blaze-grating.

12. The condenser system of claim 11 wherein the phase grating has more than 2 levels.

13. The condenser system of claim 8 wherein the one or more spectral filters is fabricated on one or more grazing incidence flat mirrors.

14. The condenser system of claim 13 wherein the grating is approximately a linear grating.

15. The condenser system of claim 13 wherein the grating is an off-axis section of a focusing grating.

16. The condenser system of claim 15 wherein the minimum spat frequency of the grating is large enough to separate the undiffracted light and the first diffracted order which has an EUV wavelength.

17. The condenser system of claim 7 wherein the one or more spectral filters is fabricated on one or more flat mirrors with angles of incidence less than 30 degrees.

18. The condenser system of claim 17 wherein the grating is approximately a linear grating.

19. The condenser system of claim 17 wherein the grating is an off-axis section of a focusing grating.

20. The condenser system of claim 19 wherein the minimum spatial frequency of the grating is large enough to separate the undiffracted light and the first diffracted order which has an EUV wavelength.

21. The condenser system of claim 1 wherein the one or more diffractive spectral filters comprise cooling means.

22. A condenser system for use with a ringfield camera comprising:
  a small compact source of continuous spectrum of radiation light;
  collector mirrors comprising at least two substantially equal radial segments of a parent aspheric mirror, each having one focus at the radiation source and a curved line focus filling the object field of the camera at the radius of the ringfield and each producing a beam of radiation;
  a corresponding number of sets of correcting mirror means which are capable of translation or rotation, or both, such that all of the beams of radiation pass through the entrance pupil of the camera and form a coincident arc image at the ringfield radius, wherein at least one of the correcting mirrors of each set, or a mirror that is common to said sets of mirrors, from which the radiation emanates, is a concave relay mirror that is positioned to shape a beam segment having a chord angle of about 25 to 85 degrees into a second beam segment having a chord angle of about 0 to 60 degrees; and
  wherein one or more of the corresponding number of sets of correcting mirror means includes diffractive spectral filter means for separating first radiation light having a particular wavelength from the continuous spectrum of radiation light.

23. The condenser system of claim 22 further comprising one or more absorptive member for absorbing at least a portion of radiation light of a wavelength other than that of the first radiation light.

24. The condenser system of claim 22 wherein the first radiation light has a wavelength of about 13.4 nm.

25. The condenser system of claim 22 wherein the said collector mirrors comprise six substantially equal radial segments of a parent aspheric mirror.

26. The condenser system of claim 22 wherein said concave relay mirror shapes a beam having a chord angle of about 50 degrees into a second beam having a chord angle of about 28 degrees.

27. The condenser system of claim 26 wherein the concave relay mirror reflects radiation from the source of radiation at an angle of incidence greater than 50 degrees as measured from normal at the center of the concave relay mirror.

28. The condenser system of claim 22 wherein the one or more spectral filters is fabricated on one or more of the corresponding number of sets of correction mirror means.

29. The condenser system of claim 28 wherein the one or more spectral filters comprise a diffraction grating that has a blazed-phase configuration.

30. The condenser system of claim 29 wherein the diffraction grating has a spatial frequency of about 70 mm$^{-1}$ to 2000 mm$^{-1}$ and a blaze height of about 5 nm to 8 nm.

31. The condenser system of claim 29 wherein the one or more spectral filters is fabricated on one or more grazing incidence mirrors and the diffraction grating has a spatial frequency of about 70 mm$^{-1}$ to 1000 mm$^{-1}$ and a blaze height of about 25 nm to 50 nm.

32. The condenser system of claim 29 wherein the diffraction grating is a discrete profile blaze-grating.

33. The condenser system of claim 32 wherein the phase grating has more than 2 levels.

34. The condenser system of claim 29 wherein the one or more spectral filters is fabricated on one or more grazing incidence flat mirrors.

35. The condenser system of claim 34 wherein the grating is approximately a linear grating.

36. The condenser system of claim 34 wherein the grating is an off-axis section of a focusing grating.

37. The condenser system of claim 36 wherein the minimum spatial frequency of the grating is large enough to separate the undiffracted light and the first diffracted order which has an EUV wavelength.

38. The condenser system of claim 22 wherein the one or more spectral filters comprise cooling means.

39. The condenser system of claim 22 wherein the one or more spectral filters is fabricated on one or more flat mirrors with angles of incidence less than 30 degrees.

40. The condenser system in 39 wherein the grating is approximately a linear grating.

41. The condenser system in 39 wherein the grating is an off-axis section of a focusing grating.

42. The condenser system in 41 wherein the minimum spatial frequency of the grating is large enough to separate the undiffracted light and the first diffracted order which has an EUV wavelength.

43. A condenser system for generating a beam of radiation that is directed to a mask comprising:
  a source of radiation that generates a continuous spectrum of radiation light;
  a condenser comprising one or more first optical elements for collecting radiation from said source of radiation light and for generating a beam of radiation; and
  a diffractive spectral filter comprising (i) a diffraction grating that has a blazed-phase configuration and that is fabricated on one or more grazing incidence mirrors wherein the diffraction grating has curved rulings and is a focusing grating that separates first radiation light having a particular wavelength from the continuous spectrum of radiation light and (ii) one or more absorptive members for absorbing at least a portion of radiation light of a wavelength other than that of the first radiation light so that radiation reaching the mask comprises the first radiation light.

44. The condenser system of claim 43 wherein the first radiation light has a wavelength of about 13.4 nm.

45. The condenser system of claim 43 wherein the diffraction grating is discrete profile blazed-grating.

46. The condenser system of claim 45 wherein the phase grating has more than 2 levels.

47. The condenser system of claim 43 wherein the diffractive spectral filter comprises cooling means.

48. The condenser system of claim 43 wherein the grating is approximately a linear grating.

49. The condenser system of claim 43 wherein the grating is on a curved surface.

50. A condenser system for generating a beam of radiation that is directed to a mask comprising:
  a source of radiation that generates a continuous spectrum of radiation light;
  a condenser comprising one or more first optical elements for collecting radiation from said source of radiation light and for generating a beam of radiation; and
  a diffractive spectral filter comprising (i) a diffraction grating that has a blazed-phase configuration and is fabricated on one or more near normal mirrors wherein the diffraction grating separates a first radiation light having a particular wavelength from the continuous spectrum of radiation light, and (ii) one or more absorptive members for absorbing at least a portion of the radiation light of a wavelength other than that of the first radiation light so that radiation reaching the mask comprises the first radiation light having a wavelength of from about 9 nm to 18 nm.

51. The condenser system of claim 50 wherein the first radiation light has a wavelength of about 13.4 nm.

52. The condenser system of claim 50 wherein the diffractive spectral filter comprises cooling means.

53. A condenser system for generating a beam of radiation that is directed to a mask comprising:

a source of radiation that generates a continuous spectrum of radiation light;

a condenser comprising one or more first optical elements for collecting radiation from said source of radiation light and for generating a beam of radiation; and a diffractive spectral filter comprising (i) a diffraction grating that has a blazed-phase configuration and is fabricated on one or more near normal mirrors wherein the diffraction grating separates a first radiation light having a particular wavelength from the continuous spectrum of radiation light, and (ii) one or more absorptive members for absorbing at least a portion of the radiation light of a wavelength other than that of the first radiation light so that radiation reaching the mask comprises the first radiation light and the diffractive spectral filter comprises cooling means.

54. The condenser system of claim 53 wherein the first radiation light has a wavelength of about 13.4 nm.

* * * * *